United States Patent
Li et al.

(10) Patent No.: US 7,875,968 B2
(45) Date of Patent: Jan. 25, 2011

(54) LEADFRAME, SEMICONDUCTOR PACKAGE AND SUPPORT LEAD FOR BONDING WITH GROUNDWIRES

(75) Inventors: Wu Hu Li, Singapore (SG); Mohamad Yazid Wagiman, Singapore (SG); Min Wee Low, Singapore (SG)

(73) Assignee: Infineon Technologies AG, Munich (DE)

( * ) Notice: Subject to any disclaimer, the term of this patent is extended or adjusted under 35 U.S.C. 154(b) by 122 days.

(21) Appl. No.: 12/026,323

(22) Filed: Feb. 5, 2008

(65) Prior Publication Data

US 2008/0128741 A1 Jun. 5, 2008

Related U.S. Application Data

(63) Continuation of application No. PCT/SG2005/000269, filed on Aug. 5, 2005.

(51) Int. Cl.
H01L 23/495 (2006.01)
H01L 23/02 (2006.01)
H01L 23/48 (2006.01)

(52) U.S. Cl. .................. 257/692; 257/670; 257/676; 257/696

(58) Field of Classification Search .................. 257/666, 257/669, 670, 674, 676, 691, 692, 784, 696
See application file for complete search history.

(56) References Cited

U.S. PATENT DOCUMENTS

| | | | |
|---|---|---|---|
| 4,714,952 A * | 12/1987 | Takekawa et al. | 257/665 |
| 4,803,540 A | 2/1989 | Moyer et al. | |
| 5,008,776 A * | 4/1991 | Queyssac | 361/728 |
| 5,168,368 A * | 12/1992 | Gow et al. | 257/666 |
| 5,334,872 A * | 8/1994 | Ueda et al. | 257/675 |
| 5,386,141 A * | 1/1995 | Liang et al. | 257/676 |
| 5,440,170 A * | 8/1995 | Tsuji et al. | 257/676 |
| 5,457,340 A | 10/1995 | Templeton, Jr. et al. | |
| 5,606,199 A * | 2/1997 | Yoshigai | 257/666 |
| 5,789,806 A * | 8/1998 | Chua et al. | 257/676 |
| 5,907,184 A | 5/1999 | Corisis et al. | |
| 5,929,514 A * | 7/1999 | Yalamanchili | 257/676 |
| 6,118,173 A * | 9/2000 | Emoto | 257/666 |
| 6,198,163 B1 | 3/2001 | Crowley et al. | |
| 6,225,683 B1* | 5/2001 | Yalamanchili et al. | 257/666 |
| 6,611,048 B1* | 8/2003 | Fazelpour et al. | 257/670 |
| 7,321,160 B2* | 1/2008 | Hinkle et al. | 257/666 |
| 2002/0070433 A1 | 6/2002 | Huang et al. | |
| 2004/0061204 A1* | 4/2004 | Han et al. | 257/666 |
| 2004/0238921 A1* | 12/2004 | Lee et al. | 257/666 |

(Continued)

Primary Examiner—Teresa M Arroyo
(74) Attorney, Agent, or Firm—Slater & Matsil, L.L.P.

(57) ABSTRACT

Leadframe for a semiconductor package and manufacturing from such leadframe including a plurality of connection leads supported in a frame. Die mounting plate is centrally located in the leadframe and is supported by a plurality of support leads which are electrically connected to the die mounting pad and extending in a direction outwardly therefrom towards the frame. Each support lead is formed with a connection pad portion and a down set link portion. Each connection pad portion is spaced from the die mounting plate and is connected to a conductive bonding ground wire from a semiconductor device mounted on the die mounting plate. Each down set link portion is electrically connected to the die mounting pad and supports the die mounting pad in a spaced arrangement from the connection leads. The connection pad portion and the down set link portion overlap, in the direction of extension of the support lead.

28 Claims, 6 Drawing Sheets

U.S. PATENT DOCUMENTS

2005/0082645 A1* 4/2005 Lee et al. ............... 257/666
2006/0113643 A1* 6/2006 Loo et al. ............... 257/666
2008/0142938 A1* 6/2008 Chow et al. ............... 257/676
2009/0224380 A1* 9/2009 Wang et al. ............... 257/670

* cited by examiner

LEADFRAME, SEMICONDUCTOR PACKAGE AND SUPPORT LEAD FOR BONDING WITH GROUNDWIRES

This application is a continuation of co-pending International Application No. PCT/SG2005/000269, filed Aug. 5, 2005, which designated the United States and was published in English, of which application is incorporated herein by reference.

TECHNICAL FIELD

This invention relates to a leadframe used for electrical connection to a semiconductor device and to a semiconductor package incorporating such a leadframe. In more specific embodiments, the present invention relates to a leadframe and semiconductor package with improved ground wire bonding between a semiconductor device and the leadframe.

BACKGROUND

Semiconductor packages incorporating leadframes are well known and widely used in the electronics industry for housing, mounting and interconnecting semiconductor devices. Well known types of semiconductor devices are connected to a leadframe and then encapsulated in a protective package envelope for a wide variety of applications. The semiconductor devices are generally integrated circuits (ICs) formed on a die or chip cut from a semiconductor wafer.

Figure 1A:
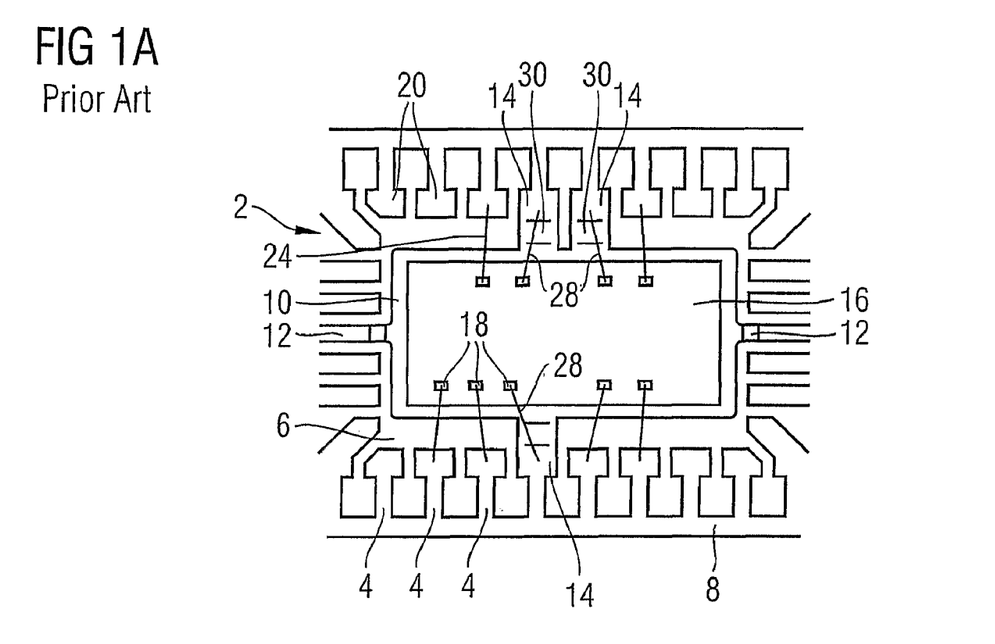
FIGS. 1A to 1C show plan views of prior art leadframes with semiconductor devices attached to them and bonding wires extending between the leadframe and device, with FIG. 1D showing an enlarged portion of FIG. 1A.
Figure 1B:
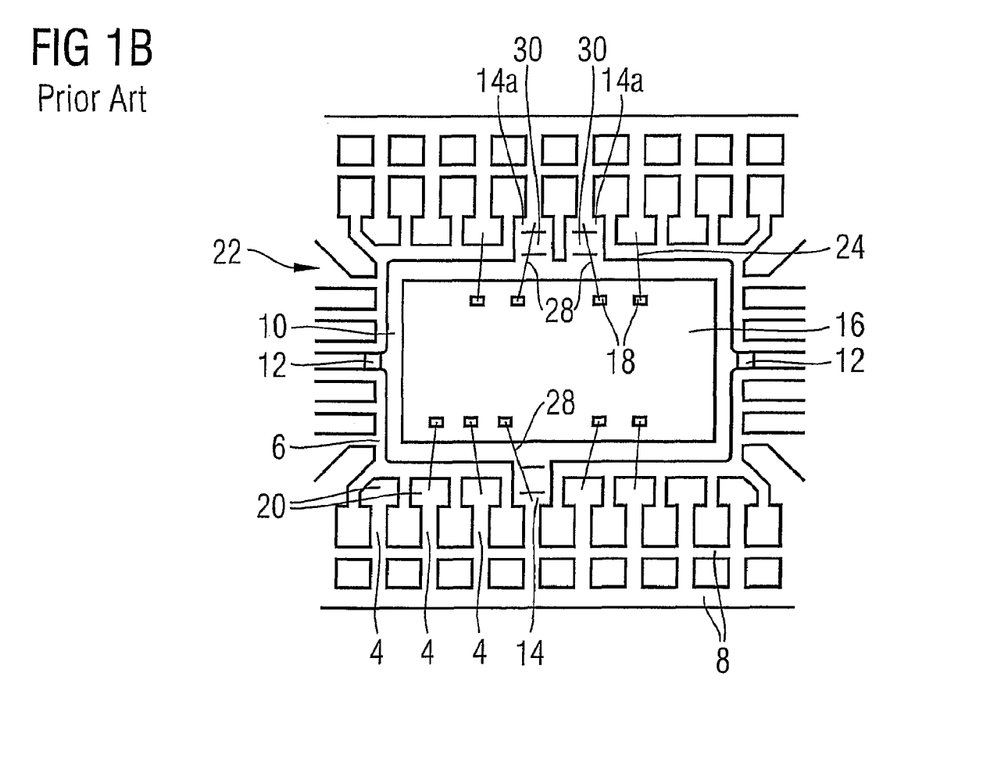
Figure 1C:
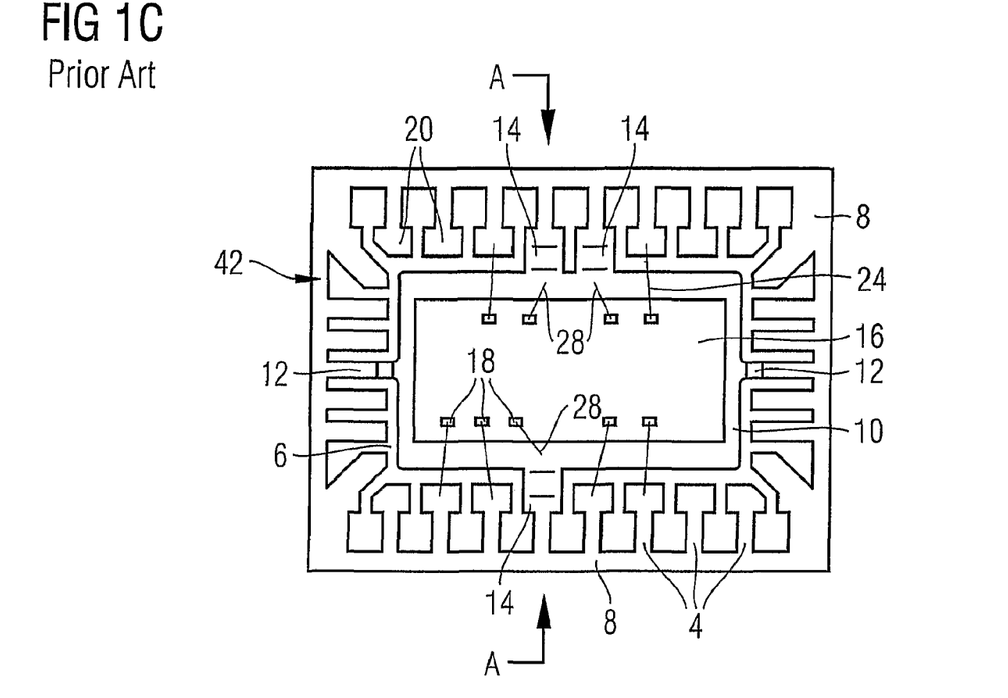
Figure 2:
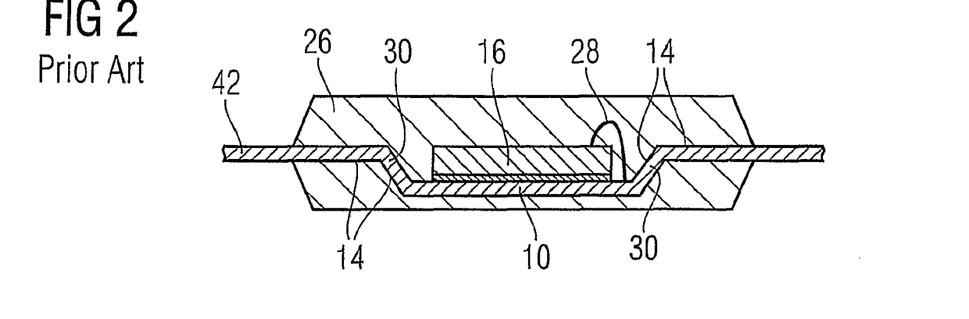
FIG. 2 shows a cross-sectional view of a semiconductor package incorporating the leadframe of FIG. 1C with the cross section taken at line AA of FIG. 1C.

Currently known leadframes 2, 22, 42 are shown in FIGS. 1A to 1C respectively. Each of the leadframes 2, 22, 42 includes a plurality of electrically conducting leads 4 that are held together temporarily during package manufacture in a planar arrangement about a central opening 6. They are held together by expendable dam bars 8 which form a frame supporting the leads 4. A die mounting pad 10 is supported within the central opening 6 by tie bars 12 (which provide a mechanical connection only and are used only when the package is being manufactured) and fused leads 14 (which provide a mechanical and electrical connection). The leads 4 extend from a first end which joins to the dam bars 8 to an enlarged opposite inner end 20 adjacent the central opening 6 and spaced from the die mounting pad 10. The tie bars 12 and fused leads 14 that support the die mounting pad 10 are angled downwardly (as shown in FIG. 2), which is known as down setting, so that the die mounting pad 10 is vertically displaced below the plane of the leads 4.

A semiconductor device, such as an IC die 16 is attached to the die mounting pad 10 during the process of semiconductor package manufacture. The semiconductor device 16 is attached to the die mounting pad 10 by any one of the attachment methods known in the field, for example, by solder, adhesive or double sided adhesive tape.

After the semiconductor device 16 is attached to the die mounting pad 10, wire bonding pads 18 on top of the semiconductor device 16 are electrically connected to corresponding ones of the inner ends 20 of the leads 4. Fine conductive bonding wire 24 is used to make the electrical connection so as to connect power, ground and signals between the semiconductor device 16 and the leads 4.

Some of the wire bonding pads 18 serve a ground bonding function and so have to be grounded by connection either directly to the die mounting pad 10, so-called down bonding, or to a fused lead 14 electrically connected to the die mounting pad 10.

When wire bonding is complete, the bonded semiconductor device and leadframe assembly is encapsulated in a protective package envelope made of a mold compound 26, as shown in FIG. 2 for the leadframe 42 of FIG. 1C. The protective envelope may be made of any mold compound common in the field, for example, high density epoxy resin. The molding process can be any suitable molding process that is common in the field, such as transfer molding. After the assembly is encapsulated, the dam bars 8 and tie bars 12 are cut away.

In the arrangement in FIG. 1C, ground wires 28 extend from those wire bonding pads 18 on the semiconductor device 16 which serve a grounding function, directly to the die mounting pad 10. The interface between the mold compound 26 and the die mounting pad 10 is susceptible to delamination over time, which can cause the electrical connection between the ground wires 28 and the die mounting pad 10 to weaken or break. Delamination can be prevented by using selective silver plating on the die mounting pad 10, but the ability to selectively plate in this way is limited by the capability of leadframe suppliers in plating technology. Also, selective plating in this way customizes the leadframe too much. Delamination can also be prevented by using an adhesion promoter, but this increases the cost of producing the semiconductor package due to added processing of the leadframe.

In order to overcome the problem of delamination weakening the ground wire connection, it is also known to bond the ground wires 28 directly onto the horizontal portion of the fused leads 14, as is shown in FIGS. 1A and 1B. In FIGS. 1A and 1B, each fused lead 14 has a bonding region 14a co-planar with the leads 4 and a downset region 30 angled down from the plane of the leads 4. This can cause instability during wire bonding due to bonding near the downset or angled down region 30 of the fused leads 14.

Figure 1D:
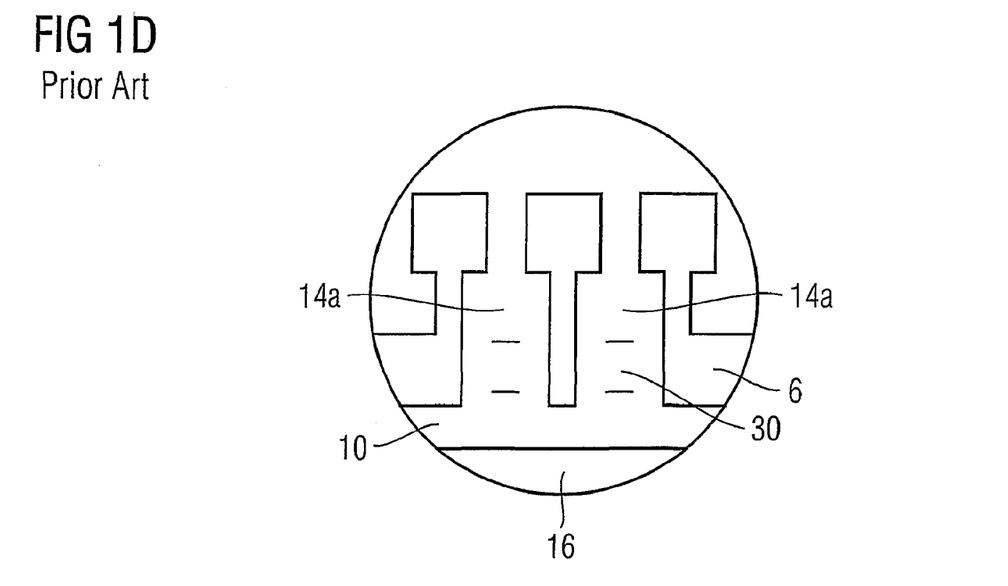

FIG. 1D shows the pair of fused leads 14 at the top of FIG. 1A in more detail. Each fused lead 14 has two regions, a bonding region 14a, on a level with the leads 4 and a downset or angled down region 30. In the embodiment shown in FIGS. 1A and 1D the bonding region 14a is of increased surface area so as to provide a large enough area to which to bond the ground wires 28 in a stable manner. However, by increasing the size of the bonding region 14a of the fused leads 14, the overall length of the fused leads 14 is increased, leading to a wider central opening 6, which restricts the size of the die mounting pad 10 and so limits the size of the semiconductor device 16 which can be used in a semiconductor package incorporating the leadframe 2 of FIG. 1A.

The bonding region 14a in FIG. 1B has not been enlarged as in the FIG. 1A embodiment. This has the advantage that a larger semiconductor device 16 can be used in a semiconductor package incorporating the leadframe 22 of FIG. 1B.

However, the bonding region 14a may not be large enough for a reliable bond between the groundwires 28 and the bonding region 14a.

Accordingly there is a requirement for a design of leadframe which enables good bonding for the groundwires without limiting the size of a semiconductor device which can be mounted on the leadframe.

SUMMARY OF THE INVENTION

An embodiment of the invention includes a semiconductor package and leadframe for a semiconductor package, comprising a connection lead supporting frame; a die mounting plate located inside the frame; a plurality of connection leads extending inwardly from the frame and terminating adjacent to the die mounting plate but separated therefrom; and a support lead electrically connected to the die mounting plate and extending in a direction outwardly therefrom towards the frame; wherein the support lead comprises a connection pad portion and a down set link portion which overlap in the direction of extension of the support lead.

An embodiment of the invention includes a semiconductor package of the type comprising a package body; a die mounting plate to which is fixed a semiconductor device, both mounted within the package body; a plurality of metal leads having inner ends embedded within the package body and terminating adjacent the die mounting plate and separated therefrom and having outer ends extending out of the package body; a support lead having an inner end embedded within the package body and electrically connected to the die mounting plate and extending in a direction outwardly therefrom; and a plurality of bonding wires for electrically connecting the semiconductor device to the leads; wherein the support lead includes a connection pad portion and a down set link portion which overlap in the direction of extension of the support lead.

An embodiment of the invention includes a leadframe for a semiconductor package including a plurality of connection means for electrically connecting to a semiconductor device, comprising frame means for supporting the connection means; die mounting means for supporting a semiconductor device; the connection means extending inwardly from the frame means and separated from the die mounting means; and a support means electrically connected to the die mounting means and extending in a direction outwardly therefrom; wherein the support means includes a connection pad means for electrical connection to a conductive bonding ground wire and a down set means for spacing the die mounting means from the connection means, and the connection pad means and the down set means overlap in the direction of extension of the support lead.

An embodiment of the invention includes a semiconductor package of the type, comprising semiconductor means; a die mounting means for supporting the semiconductor means, a package means for encapsulating the die mounting means and the package means; a plurality of connection means partially embedded within the package body and spaced from the die mounting means and the semiconductor means; a support means partially embedded within the package for supporting the die mounting means, electrically connected to the die mounting means and extending in a direction outwardly from the die mounting means; and a plurality of bonding wires for electrically connecting the semiconductor means to the connection means and support means; wherein the support means includes a connection pad means for electrical connection to a conductive bonding ground wire and a down set means for spacing the die mounting means from the connection means, and the connection pad means and the down set means overlap in the direction of extension of the support lead.

In the leadframes and semiconductor packages defined above, the connection leads may lie in a plane with the down set link portion of the support lead angled away from the plane so that the die mounting plate is supported by the support lead spaced apart from, and preferably co-planar with the plane.

The down set link portion may be connected to the die mounting plate. The connection pad portion may be spaced from the die mounting plate so that it is suitable for electrical connection to a semiconductor device supported by the die mounting plate by a conductive bonding ground wire. In order to achieve this, the connection pad portion may be formed with a flat surface.

The leadframe or semiconductor packages defined above may comprise a plurality of support leads, spaced around the die mounting plate so as to support the die mounting plate.

The support lead may branch to form a first branch portion forming the connection pad portion, which connection pad portion is spaced from the die mounting plate and a second branch portion forming the down set portion, which down set portion is connected to the die mounting plate. In addition the support lead may branch to form a third branch portion for forming a lead portion, which lead portion extends outwardly towards the frame.

In some configurations the support lead may comprise a bridge portion extending laterally to the direction of extension for connecting the downset portion, which downset portion is connected to the die mounting plate, to at least two connection pad portions, which connecting pad portions are spaced from the die mounting plate. In other configurations the support lead may comprise a bridge portion extending laterally to the direction of extension for connecting the downset portion, which downset portion is connected to the die mounting plate, to at least one connection pad portion, with each connection pad portion spaced from the die mounting plate, and to at least one lead portion, with each lead portion extending outwardly towards the frame.

The connecting leads may be provided with enlarged inner ends adjacent to the die mounting plate with a flat bonding surface area suitable for bonding to a bonding wire wherein the connection pad portions may be provided with a flat bonding surface area of a similar size to the bonding surface area of the connecting leads. Furthermore, the connection pad portions may be formed with a similar or substantially the same shape as the shape of an enlarged inner end of a connecting lead.

A leadframe as defined above may be provided as a strip comprising a plurality of identical leadframe units attached end to end. A leadframe as defined above may be provided as a matrix comprising a plurality of identical leadframe units attached to each other in a matrix formation.

Features described in relation to one aspect of the invention may also be applicable to other aspects of the invention.

BRIEF DESCRIPTION OF THE DRAWINGS

Known arrangements have already been described with reference to FIGS. 1 and 2 of the accompanying drawings, of which.

Preferred features of the invention will now be described, for the sake of illustration only, with reference to FIGS. 3 to 6 of the accompanying drawings, of which.

DETAILED DESCRIPTION OF ILLUSTRATIVE EMBODIMENTS

Various embodiments of the invention will be described. The descriptions are intended to be illustrative, not limitative. Thus, it will be apparent to one skilled in the art that certain modifications may be made to the invention as described without departing from the scope of the claims set out below.

Figure 3A:
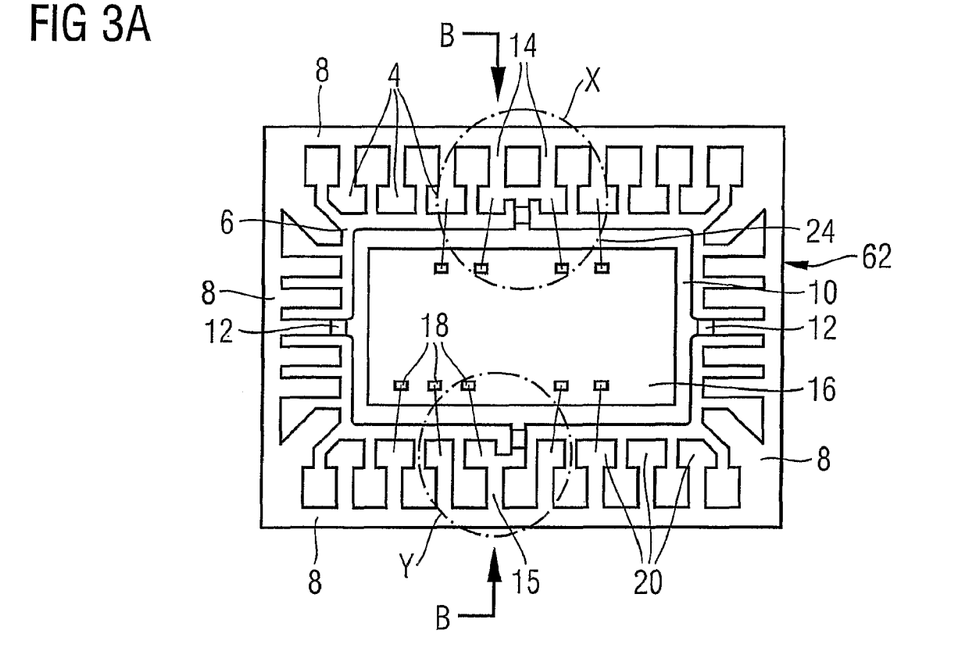
FIG. 3A shows a plan view of a leadframe according to an embodiment of the present invention with a semiconductor device attached to it and bonding wires extending between the leadframe and device.
Figure 3B:
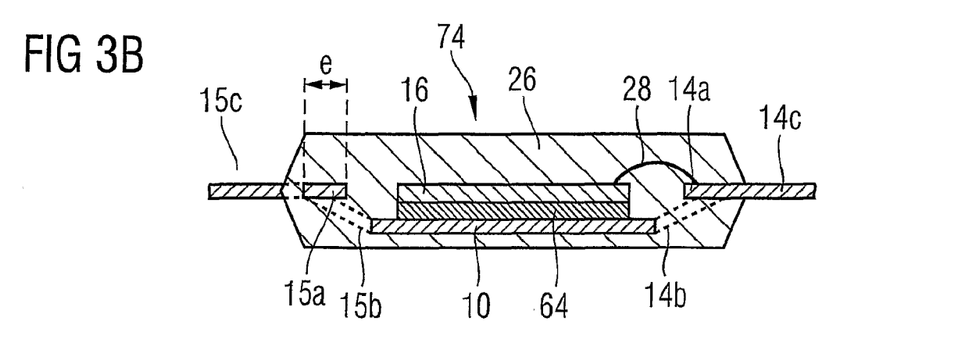
FIG. 3B shows a cross-sectional view of a semiconductor package according to an embodiment of the present invention incorporating the leadframe of FIG. 3A with cross-section taken at line BB of FIG. 3A.
Figure 4A:
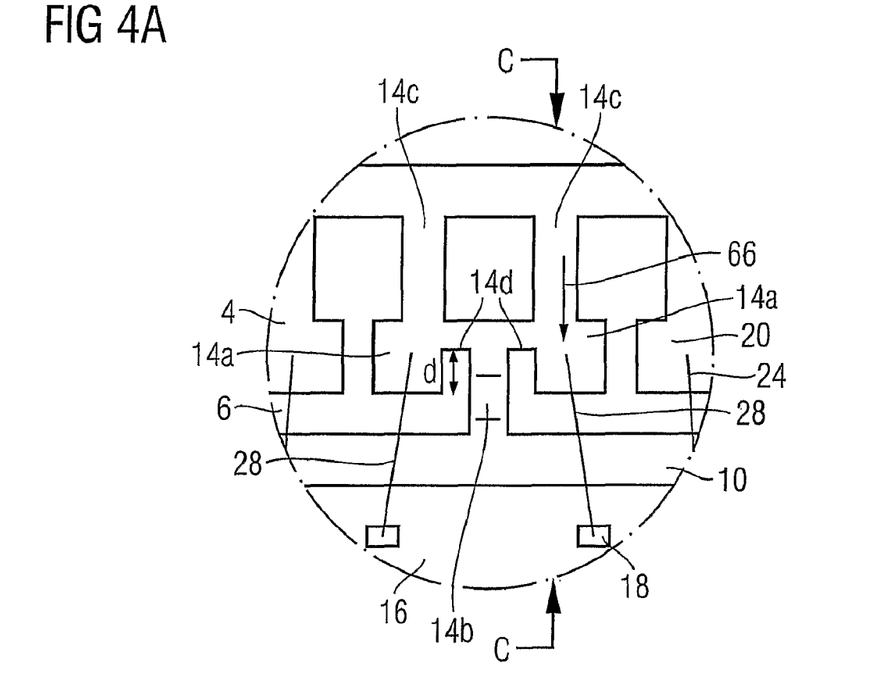
FIGS. 4A and 4B show enlarged portions of FIG. 3A labelled X and Y respectively.
Figure 4B:
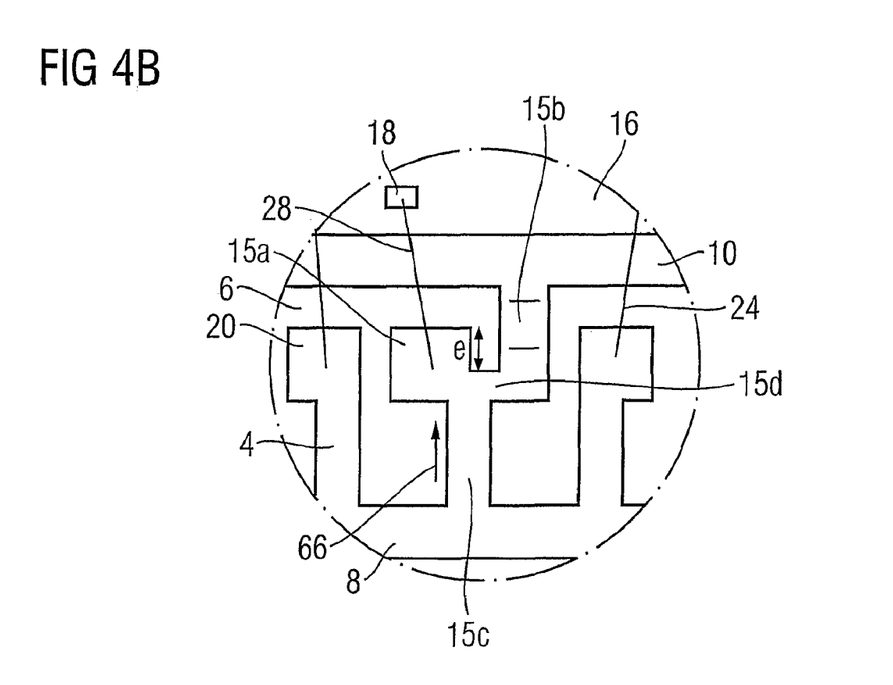
Figure 5:
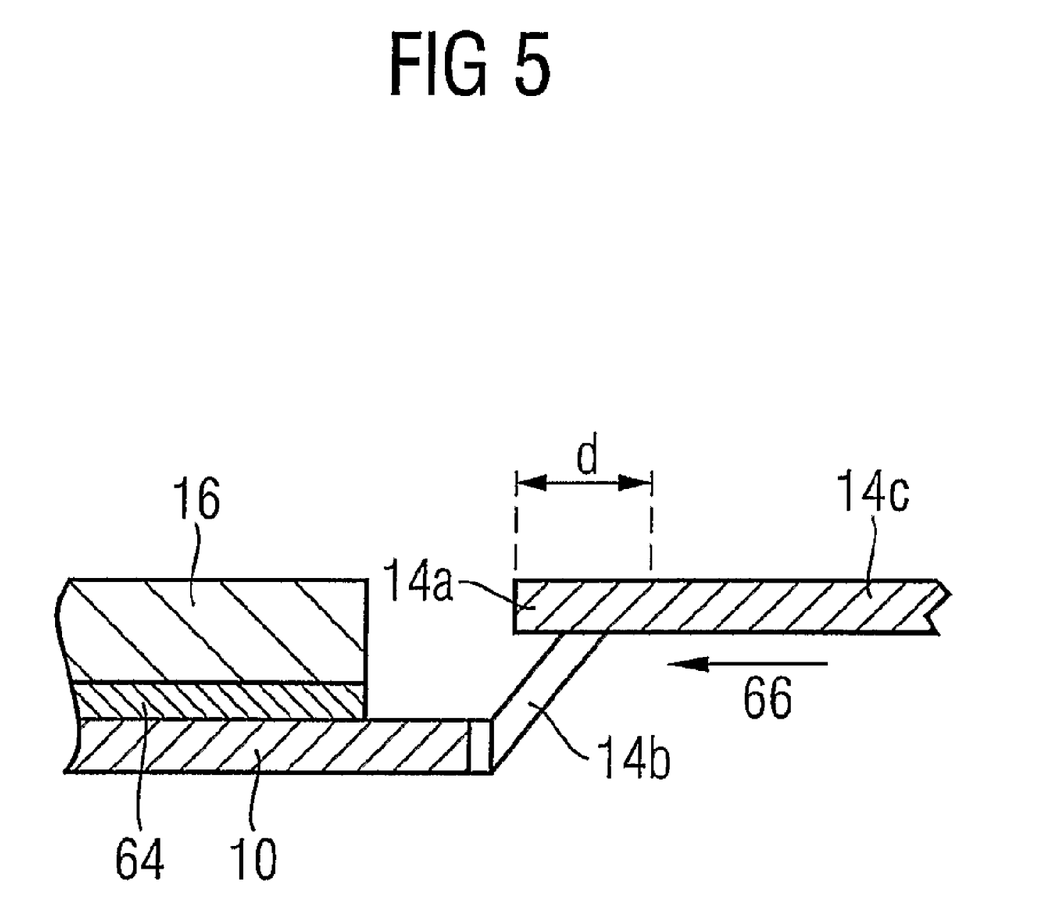
FIG. 5 shows a cross-sectional view taken at lines CC of FIG. 4A.

A leadframe 62 according to an embodiment of the present invention is shown in FIG. 3A with the enlarged portions of FIG. 3A labelled X and Y shown in FIGS. 4A and 4B respectively. The leadframe 62 includes a plurality of connection leads in the form of electrically conducting leads 4 that are held together temporarily during package manufacture in a planar arrangement about a central opening 6. They are held together by expendable dam bars 8 which form a frame enclosing the leads 4. A die mounting pad 10 is supported within the central opening 6 by tie bars 12, which provide mechanical connection only and one or more support leads in the form of fused leads 14, 15, which provide both electrical and mechanical connection. The leads 4 extend from a first end which joins to the dam bars 8 to an enlarged opposite inner end 20 spaced from the die mounting pad by the central opening 6. The fused leads 14, 15 and tie bars 12 that support the die mounting pad 10 are angled downwardly (as shown in FIGS. 3B and 5), which is known as down setting, so that the die mounting pad 10 is vertically displaced co-planar with and below the plane of the leads 4.

The connecting leads 4 are provided with enlarged inner ends 20 adjacent to but spaced from the die mounting plate 10. The inner ends 20 are shaped to have an upper surface with a flat bonding surface area large enough for stable bonding to a bonding wire. The connection pad portions 14a, 15a (FIG. 3B) are also provided with a flat bonding surface area of a similar size to the bonding surface area of the connecting leads 20, so as to enable stable bonding of a bonding ground wire to the connection pad portions. For example, the connection pad portions 14a, 15a are formed with a flat bonding surface area at least half, preferably at least two thirds of the bonding surface area of the connecting leads 20. The connecting pad portions 14a, 15a have a rectangular shape, which is similar to the rectangular shape of the enlarged inner ends 20 of the connection leads 4.

A semiconductor device, such as an IC die 16 is attached to the die mounting pad 10 during the process of semiconductor package manufacture. The semiconductor device 16 is attached to the die mounting pad 10 by any one of the attachment methods known in the field, for example by solder, adhesive 64 or double sided adhesive tape.

After the semiconductor device 16 is attached to the die mounting pad 10, wire bonding pads 18 on top of the semiconductor device 16 are electrically connected to corresponding ones of the inner ends 20 of the leads 4. Fine conductive bonding wire 24 is used to make the electrical connection so as to connect power, ground and signals between the semiconductor device 16 and the leads 4.

In the arrangement of FIG. 3A, the problem of groundwire bonding that is discussed above is overcome by branching the fused leads 14, 15 into at least one connection pad 14a, 15a co-planar with the inner ends 20 of the leads 4 and a down setting link 14b, 15b (FIG. 3B) which is angled down from the level of the leads 4 so as to connect with the die mounting pad 10. The fused lead branches such that a portion of each connection pad 14a, 15a overlaps with the respective downsetting link 14b, 15b in the direction of extension of the fused leads 14, 15 from the dam bar 8 to the die mounting pad 10. By separating the fused lead into a connection pad portion and a down set portion and by arranging them side by side (with respect to the direction of extension of the fused lead between the die mounting pad 10 and the frame 8) the connection pad 14a can be made large enough for a groundwire 28 to reliably bond to without the size of the die mounting pad 10 being limited.

In FIG. 3A the die mounting pad 10 is supported at its short edges in the central opening 6 by two tie bars 12. The die mounting pad 10 is supported at its long edges in the central opening 6, at one of its long edges by fused lead 14 and at its opposite long edge by fused lead 15. Tie bars 12 are simply used to support the mounting pad 10 in relation to the dam bar 8 while the package is being manufactured; they are not required for electrical connection. Fused leads 14, 15 also support the mounting pad 10 in relation to the dam bar 8, but they are also used as electrical connections, i.e., one of the bonding pads 18 on the IC package will need to be connected to each fused lead 14, 15. Tie bars 12 and fused leads 14, 15 each span the central opening 6.

With reference to FIGS. 3A, 3B, 4A and 5, the fused lead 14, made up of portions 14a, 14b, 14c, 14d is branched to form two connection pads 14a, one arranged to each side of a down setting link 14b. Each of the connection pads 14a, has an associated lead portion 14c extending to the dam bar 8. FIG. 5 shows a cross section of the portion of the leadframe 62 shown in FIG. 4A taken at lines CC. It can be seen that the connection pad 14a of the fused lead 14, overlaps by a distance d with the down setting link 14b in the direction of extension (shown by arrow 66) of the fused lead 14 between the dam bar 8 and the die mounting pad 10. Two branches 14d connect the down setting link 14b with respective connection pads 14a.

The branches 14d form a bridge portion of the support lead. The bridge portion 14d extends laterally to the direction of extension 66 of the fused lead 14 and connects the downset portion 14b, which downset portion is connected to the die mounting pad 10, to two connection pad portions 14a which are each spaced from the die mounting pad 10. In addition, the bridge portion 14b connects to two lead portions 14c which extend outwardly towards the dam bars 8 of the frame.

With reference to FIGS. 3A, 3B and 4B, the fused lead 15, made up of portions 15a, 15b, 15c, 15d is branched to form a connection pad 15a, located to one side of a down setting link 15b. The connection pad 15a, has an associated lead 15c extending to the dam bar 8. FIG. 3B shows a cross section of the portion of the leadframe 62 shown in FIG. 3A taken at lines BB. It can be seen that the connection pad 15a of the fused lead 15, overlaps by a distance e with the down setting link 15b in the direction of extension (shown by arrow 66) of the fused lead 15 between the dam bar 8 and the die mounting pad 10. A branch 15d connects the down setting link 15b with the connection pad 15a.

The fused lead 15 branches to form a first branch portion forming the connection pad portion 15a and a second branch portion forming the down set portion 15b. The connection pad portion 15a is spaced from the die mounting pad 10 and the down set portion 15b is connected to the die mounting pad. In addition the fused lead 15 includes a third branch portion which forms a lead portion 15c and the lead portion 15c extends outwardly towards the dam bars 8 of the frame.

When wire bonding is complete, the bonded semiconductor device 16 and leadframe 62 assembly is encapsulated in a protective envelope made of a mold compound 26, as shown in FIG. 3B. The protective envelope may be made of any mold compound common in the field, for example, high density epoxy resin. The molding process can be any suitable molding process that is common in the field, such as transfer molding. After the assembly is encapsulated, the dam bars 8 and tie bars 12 are cut away. The wire bonding pads 18 on top of the semiconductor device 16 that serve a grounding function are electrically connected, by ground wires 28 to connection pads 14a, 15a of respective fused leads 14, 15. In FIG. 3B the down setting link portions 14b, 15b of the fused leads 14, 15 and the associated lead portion 15c of the fused lead 15, which are embedded in the mold compound 26 are shown in dotted lines.

Figure 6:
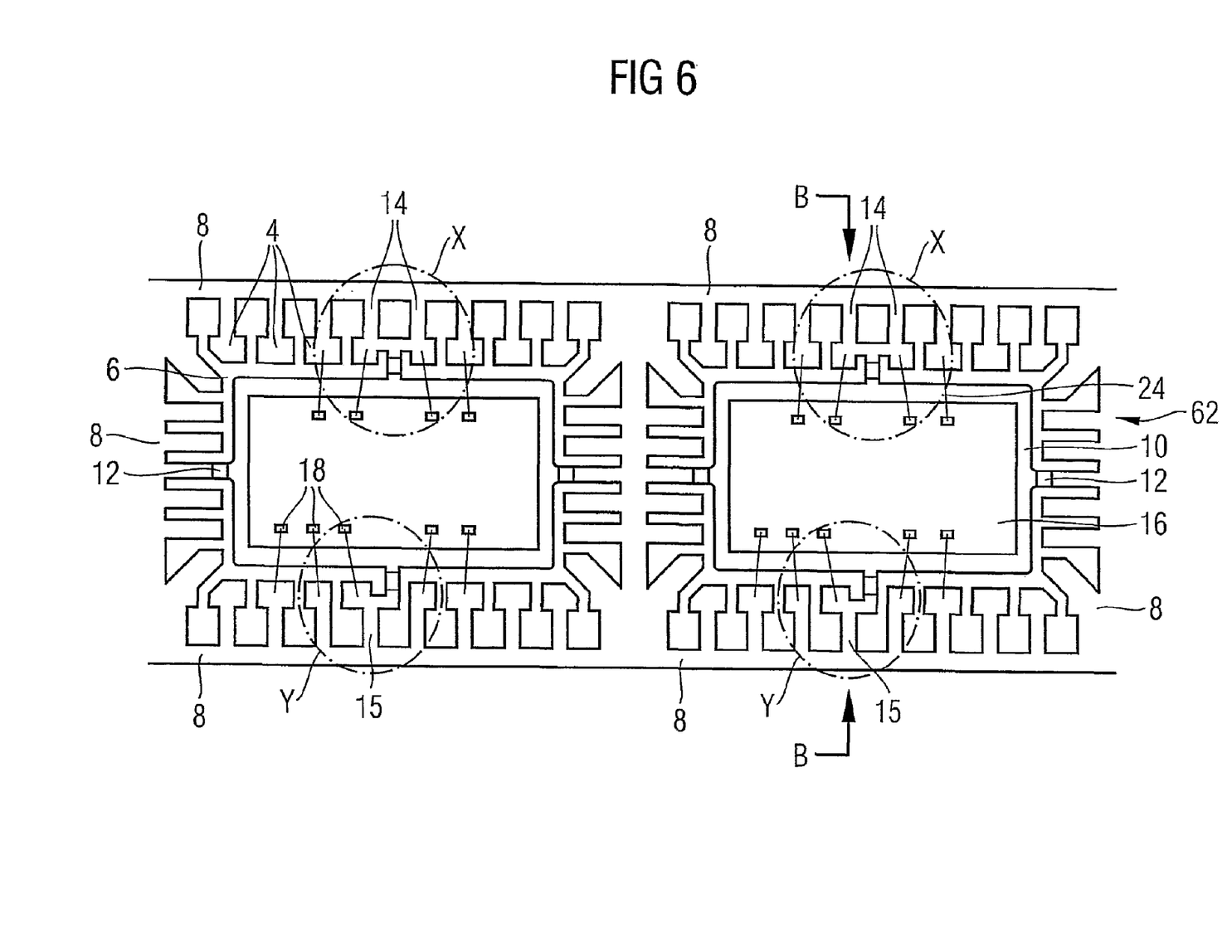
FIG. 6 shows part of a strip of a plurality of identical leadframes of the type shown in FIG. 3A attached end to end.

FIG. 6 shows how a strip may be formed from a plurality of identical leadframes of the type shown in FIG. 3A, by attaching them end to end. It may also be possible to form a matrix from a plurality of identical leadframes of the type shown in FIG. 3A, by attaching them side to side and end to end in a grid or matrix formation.

What is claimed is:

1. A leadframe for a semiconductor package, the leadframe comprising:
   a connection lead supporting frame;
   a die mounting plate located inside the frame;
   a plurality of connection leads extending inwardly from the frame and terminating adjacent the die mounting plate but separated therefrom; and
   at least one support lead electrically connected to the die mounting plate and extending in a direction outwardly therefrom towards the frame;
   wherein the support lead comprises a connection pad portion, a bridge portion, and a down set link portion, wherein the connection pad portion is coupled to the down set link portion through the bridge portion, wherein the connection pad portion and down set link portion are oriented along a direction of extension of the support lead and disposed side-by-side to each other, wherein the bridge portion is oriented perpendicular to the direction of extension of the support lead, wherein the down set link portion extends beyond the connection pad portion and the bridge portion to connect to the die mounting plate.

2. The leadframe according to claim 1, wherein the connection leads lie in a plane and the down set link portion of the support lead is angled away from the plane and the die mounting plate is supported by the support lead spaced apart form the plane.

3. The leadframe according to claim 1, wherein the connection pad portion is spaced from the die mounting plate.

4. The leadframe according to claim 1, wherein the at least one support lead comprises a plurality of support leads.

5. The leadframe according to claim 1, wherein the connection pad portion comprises a wire bonding connection pad.

6. The leadframe according to claim 1, wherein the support lead branches to form a first branch portion forming the connection pad portion spaced from the die mounting plate and a second branch portion forming the down set link portion connected to the die mounting plate.

7. The leadframe according to claim 6, wherein the first branch portion and the second branch portion are arranged side by side in the direction of extension of the support lead, thereby overlapping in the direction of extension of the support lead.

8. The leadframe according to claim 7, wherein the support lead branches to form a third branch portion for forming a lead portion that extends outwardly towards the frame.

9. The leadframe according to claim 1, wherein the at least one support lead comprises a bridge portion extending laterally to the direction of extension for connecting the down set link portion, which down set link portion is connected to the die mounting plate, to at least one connection pad portion, with each connection pad portion spaced from the die mounting plate.

10. The leadframe according to claim 9, wherein the down set link portion is connected to at least one lead portion, with each lead portion extending outwardly towards the frame.

11. The leadframe according to claim 1, wherein the lead frame is one of a plurality of identical leadframes in a leadframe strip, the plurality of leadframes being attached end to end.

12. The leadframe according to claim 1, wherein the lead frame is one of a plurality of identical leadframes in a leadframe matrix, the leadframes being attached to each other in a matrix formation.

13. A semiconductor package comprising:
    a leadframe comprising:
        a connection lead supporting frame;
        a die mounting plate located inside the frame;
        a plurality of connection leads extending inwardly from the frame and terminating adjacent the die mounting plate but separated therefrom; and
        at least one support lead electrically connected to the die mounting plate and extending in a direction outwardly therefrom towards the frame;
        wherein the support lead comprises a connection pad portion, a bridge portion, and a down set link portion, wherein the connection pad portion is coupled to the down set link portion through the bridge portion, wherein the connection pad portion and down set link portion are oriented along a direction of extension of the support lead and disposed side-by-side to each other, wherein the bridge portion is oriented perpendicular to the direction of extension of the support lead, wherein the down set link portion extends beyond the connection pad portion to connect to the die mounting plate; and
    a semiconductor die attached to the leadframe.

14. A semiconductor package, comprising:
    a package body;
    a semiconductor device;
    a die mounting plate to which is fixed the semiconductor device, both mounted within the package body;
    a plurality of metal leads having inner ends embedded within the package body and terminating adjacent the die mounting plate but separated therefrom and outer ends extending out of the package body;
    a support lead having an inner end embedded within the package body and electrically connected to the die mounting plate and extending in a direction outwardly therefrom; and
    a plurality of bonding wires for electrically connecting the semiconductor device to the metal leads and the support lead;
    wherein the support lead includes a connection pad portion, abridge portion, and a down set link portion, wherein the connection pad portion is connected to the down set link portion through the bridge portion, wherein the connection pad portion and down set link portion are oriented along a direction of extension of the support lead and disposed side-by-side to each other, wherein the bridge portion is oriented perpendicular to the direction of extension of the support lead, wherein the down set link portion extends beyond the connection pad portion to connect to the die mounting plate.

15. The semiconductor package according to claim 14, wherein metal leads lie in a plane and the down set link portion of the support lead is angled away from the plane and the die mounting plate is supported by the support lead spaced apart from the plane.

16. The semiconductor package according to claim 14, wherein the connection pad portion is spaced from the die mounting plate.

17. The semiconductor package according to claim 14, wherein the connection pad portion comprises a wire bonding connection pad.

18. The semiconductor package according to claim 14, wherein the support lead is one of a plurality of support leads, each support lead embedded within the package body and electrically connected to the die mounting plate and extending in an outwardly direction therefrom.

19. The semiconductor package according to claim 14, wherein the support lead branches to form a first branch portion forming the connection pad portion spaced from the die mounting plate and a second branch portion forming the down set link portion connected to the die mounting plate.

20. The semiconductor package according to claim 19, wherein the first branch portion and the second branch portion are arranged side by side in the direction of extension of the support lead, thereby overlapping in the direction of extension of the support lead.

21. The semiconductor package according to claim 20, wherein the support lead branches to form a third branch portion forming a lead portion which extends outwardly towards a frame.

22. The semiconductor package according to claim 14, wherein the support lead comprises a bridge portion extending laterally to a direction of extension for connecting the down set link portion, which down set link portion is connected to the die mounting plate, to at least two connection pad portions which are spaced from the die mounting plate.

23. The semiconductor package according to claim 14, wherein the support lead comprises a bridge portion extending laterally to a direction of extension for connecting the down set link portion, which down set link portion is connected to the die mounting plate, to at least one connection pad portion, with each connection pad portion spaced from the die mounting plate, and to at least one lead portion, with each lead portion extends outwardly towards the frame.

24. A leadframe for a semiconductor package, the leadframe comprising:
frame means for supporting connection means;
die mounting means for supporting a semiconductor device;
connection means for electrically connecting to a semiconductor device, the connection means extending inwardly from the frame means and separated from the die mounting means; and
a support electrically connected to the die mounting means and extending in a direction outwardly therefrom;
wherein the support includes a connection pad for electrical connection to a conductive bonding ground wire, down set means for spacing the die mounting means from the connection means, and a bridge means for coupling the connection pad to the down set means, wherein the connection pad and down set means are oriented along a direction of extension of the support and disposed side-by-side to each other, wherein the bridge means is oriented perpendicular to the direction of extension of the support, wherein the down set means extends beyond the connection pad to connect to the die mounting means.

25. The semiconductor package according to claim 14, wherein the connection pad portion is directly connected to the semiconductor device through a bonding wire.

26. The leadframe according to claim 1, wherein the connection pad portion is coupled to a ground potential node.

27. The semiconductor package according to claim 14, wherein the connection pad portion is coupled to a ground potential node.

28. A semiconductor package comprising:
a leadframe comprising:
a connection lead supporting frame;
a die mounting plate located inside the frame;
a plurality of connection leads extending inwardly from the frame and terminating adjacent the die mounting plate but separated therefrom; and
at least one support lead electrically connected to the die mounting plate and extending in a direction outwardly therefrom towards the frame;
wherein the support lead comprises a connection pad portion, a bridge portion, and a down set link portion, wherein the connection pad portion is coupled to a ground potential node, wherein the down set link portion extends beyond the connection pad portion to connect to the die mounting plate, wherein the connection pad portion is coupled to the down set link portion through the bridge portion, wherein the connection pad portion and down set link portion are oriented along a direction of extension of the support lead and disposed side-by-side to each other, and wherein the bridge portion is oriented perpendicular to the direction of extension of the support lead; and
a semiconductor die attached to the leadframe.

* * * * *